US008643016B2

United States Patent
Park et al.

(10) Patent No.: US 8,643,016 B2
(45) Date of Patent: Feb. 4, 2014

(54) DISPLAY DEVICE HAVING A PAD IN ELECTRICAL CONTACT WITH A CIRCUIT BOARD

(75) Inventors: Kyong-Tae Park, Yongin (KR); Na-Yong Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/546,999

(22) Filed: Jul. 11, 2012

(65) Prior Publication Data

US 2013/0168679 A1    Jul. 4, 2013

(30) Foreign Application Priority Data

Dec. 28, 2011 (KR) ........................ 10-2011-0144979

(51) Int. Cl.
  *H01L 29/04* (2006.01)
  *H01L 33/00* (2010.01)
  *H01L 23/48* (2006.01)
  *H01L 23/52* (2006.01)

(52) U.S. Cl.
  USPC .............. 257/59; 257/99; 257/778; 257/784

(58) Field of Classification Search
  USPC ...................................... 257/778, 59, 99, 784
  See application file for complete search history.

(56) References Cited

U.S. PATENT DOCUMENTS

| 5,731,636 | A  | * | 3/1998 | Chun ............................ 257/784 |
| 5,844,314 | A  |   | 12/1998 | Kim |
| 6,767,763 | B1 | * | 7/2004 | Uchiyama ..................... 438/116 |
| 7,446,844 | B2 |   | 11/2008 | Hong |
| 2005/0018121 | A1 | * | 1/2005 | Jen et al. ........................ 349/151 |
| 2005/0211464 | A1 | * | 9/2005 | Byun et al. ..................... 174/259 |
| 2005/0286240 | A1 | * | 12/2005 | Sakamoto et al. ............ 361/803 |
| 2007/0045647 | A1 | * | 3/2007 | Lin et al. ......................... 257/99 |
| 2007/0296659 | A1 | * | 12/2007 | Kwak et al. ..................... 345/87 |
| 2009/0153765 | A1 | * | 6/2009 | Yamashita et al. ............. 349/58 |
| 2009/0169916 | A1 |   | 7/2009 | Lee et al. |
| 2010/0155729 | A1 |   | 6/2010 | Yang et al. |

FOREIGN PATENT DOCUMENTS

| KR | 10-2005-0068855 A | 7/2005 |
| KR | 10-2006-0125450 A | 12/2006 |
| KR | 10-2007-0115068 A | 12/2007 |
| KR | 10-2010-0075054   | 7/2010 |

* cited by examiner

*Primary Examiner* — Long K Tran
*Assistant Examiner* — Dzung Tran
(74) *Attorney, Agent, or Firm* — Christie, Parker & Hale, LLP (57) ABSTRACT

A display device includes a substrate comprising a display unit for displaying an image, a non-display unit around the display unit, and at least one first pad for sending an electrical signal to the display unit, a circuit board on the substrate and comprising at least one circuit terminal, and a conductive film between the substrate and the circuit board and including a plurality of conductive particles for electrically connecting the first pad and the circuit terminal, and an insulating resin surrounding the conductive particles, wherein the first pad includes a plurality of fine pad lines, and a region into which the insulating resin is dispersed during a thermal compressing operation located between adjacent ones of the fine pad lines.

18 Claims, 9 Drawing Sheets

DISPLAY DEVICE HAVING A PAD IN ELECTRICAL CONTACT WITH A CIRCUIT BOARD

CROSS-REFERENCE TO RELATED PATENT APPLICATION

This application claims priority to and the benefit of Korean Patent Application No. 10-2011-0144979, filed on Dec. 28, 2011, in the Korean Intellectual Property Office, the disclosure of which is incorporated herein in its entirety by reference.

BACKGROUND

1. Field

Embodiments of the present invention relate to a display device.

2. Description of the Related Art

In general, organic light-emitting display devices have advantages, such as a larger viewing angle, better contrast characteristics, and a faster response time. Thus, organic light-emitting display devices have attracted much attention, as the organic light-emitting display devices can be applied to a display device for a mobile device, such as a digital camera, a video camera, a camcorder, a personal digital assistant (PDA), a smart phone, an ultra-slim notebook computer, a tablet personal computer, or a flexible display device, and can be applied to an electronic product, such as an ultra-thin television.

In a display device such as an organic light-emitting display device, a pad is patterned at a side of a substrate to supply external power, and a circuit board is electrically connected to the pad. The circuit board may be electrically connected to the pad in various ways. For example, a conductive film may be interposed between the pad and a terminal of the circuit board, and then heat and pressure may be applied to the conductive film to electrically connect the pad and the circuit board.

When adhesion between the pad, the circuit board, and the conductive film is not satisfactory, a contact resistance is greatly increased. Furthermore, the adhesion decreases over time due to heat generated during driving of a display device, stress due to residual stress, and the like. Accordingly, there is a need to enhance the adhesion between the pad, the circuit board, and the conductive film.

SUMMARY

Aspects of embodiments of the present invention provide a display device in which adhesion between a pad, a circuit board, and a conductive film is enhanced by designing a pad having a specific pattern.

According to an aspect of embodiments of the present invention, there is provided a display device including a substrate including a display unit for displaying an image, a non-display unit around the display unit, and at least one first pad for sending an electrical signal to the display unit, a circuit board on the substrate and including at least one circuit terminal, and a conductive film between the substrate and the circuit board and including a plurality of conductive particles for electrically connecting the first pad and the circuit terminal, and an insulating resin surrounding the conductive particles, wherein the first pad includes a plurality of fine pad lines, and a region into which the insulating resin is dispersed during a thermal compressing operation located between adjacent ones of the fine pad lines.

Orientations of the fine pad lines patterned on the substrate may be changed at least once in one direction of the substrate.

The fine pad lines may be arranged in a zigzag pattern.

The fine pad lines may include a plurality of first fine pad lines arranged apart from one another in one direction of the substrate, and a plurality of second fine pad lines arranged apart from one another in another direction of the substrate, and the first fine pad lines and the second fine pad lines may be electrically connected to each other to form a mesh-type pattern.

The fine pad lines may include a plurality of first fine pad lines diagonally arranged apart from one another in one direction of the substrate, and a plurality of second fine pad lines diagonally arranged apart from one another in another direction of the substrate, and the first fine pad lines and the second fine pad lines may be electrically connected to each other to form a mesh-type pattern.

The plurality of fine pad lines may be electrically connected to one another to form a honeycomb pattern.

The display device may further include a bridge line between the adjacent ones of the fine pad lines for electrically connecting the adjacent ones of the fine pad lines, and the fine pad lines may be arranged apart from one another in one direction of the substrate.

The fine pad lines may be electrically connected to one another via a connection line.

The substrate may be for an organic display device, and a semiconductor active layer having source and drain regions and a channel region, a gate insulating layer on the semiconductor active layer, a gate electrode on the gate insulating layer, an interlayer insulating layer on the gate electrode and having a contact hole, source and drain electrodes electrically connected to the source and drain regions, respectively, and a protection layer on the interlayer insulating layer, may be located in the display unit on the substrate, and the first pad may be electrically connected to the gate electrode or the source and drain electrodes in the non-display unit around the display unit.

The display device may further include a second pad electrically connected to the first pad at a layer other than a layer at which the first pad is located.

The second pad may be between the first pad and the substrate.

Orientations of the fine pad lines patterned on the substrate may be changed at least once in one direction of the substrate, and the second pad may have a solid type pattern in which the fine pad lines are arranged on one surface thereof.

The fine pad lines may include a plurality of first fine pad lines arranged apart from one another in one direction of the substrate, and a plurality of second fine pad lines arranged apart from one another in another direction of the substrate, and the first fine pad lines and the second fine pad lines may be electrically connected to each other to form a mesh-type pattern, and the second pad may have a solid type pattern in which the fine pad lines are arranged on one surface thereof.

The fine pad lines may include a plurality of first fine pad lines diagonally arranged apart from one another in one direction of the substrate, and a plurality of second fine pad lines diagonally arranged apart from one another in another direction of the substrate, and the first fine pad lines and the second fine pad lines may be electrically connected to each other to form a mesh-type pattern, and the second pad may have a solid type pattern in which the fine pad lines are arranged on one surface thereof.

The plurality of fine pad lines may be electrically connected to one another to form a honeycomb pattern, and the second pad may have a solid type pattern in which the fine pad lines are arranged on one surface thereof.

The display device may further include a bridge line between the adjacent ones of the fine pad lines for electrically connecting the adjacent ones of the fine pad lines, and the fine pad lines may be arranged apart from one another in one direction of the substrate, and the second pad may have a solid type pattern in which the fine pad lines are arranged on one surface thereof.

The substrate may be for an organic display device, and a semiconductor active layer having source drain regions and a channel region, a gate insulating layer on the semiconductor active layer, a gate electrode on the gate insulating layer, an interlayer insulating layer that is on the gate electrode and in which a contact hole is located, source and drain electrodes that are electrically connected to the source drain regions, respectively, and a protection layer on the interlayer insulating layer, may be located in the display unit on the substrate, and the first pad may be electrically connected to the gate electrode in the non-display unit, and the second pad may be electrically connected to the source and drain electrodes in the non-display unit.

The conductive film may include an anisotropic conductive film (ACF).

An integrated chip (IC) may be mounted on the circuit board that is flexible.

BRIEF DESCRIPTION OF THE DRAWINGS

The above and other features and aspects of embodiments of the present invention will become more apparent by describing in detail exemplary embodiments thereof with reference to the attached drawings in which.

DETAILED DESCRIPTION

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of embodiments of the present invention, certain detailed explanations of related art are omitted when it is deemed that they may unnecessarily obscure the essence of embodiments of the present invention.

While terms such as "first," "second," etc., may be used to describe various components, such components must not be limited to the above terms. The above terms are used only to distinguish one component from another.

The terms used in the present specification are merely used to describe particular embodiments of the present invention, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The display device according to embodiments of the present invention will be described below in more detail with reference to the accompanying drawings. Those components that are the same or are in correspondence are rendered the same reference numeral regardless of the figure number, and redundant explanations are omitted. As used herein, the term "and/or" includes any and all combinations of one or more of the associated listed items. Expressions such as "at least one of," when preceding a list of elements, modify the entire list of elements, and do not modify the individual elements of the list.

Figure 1:
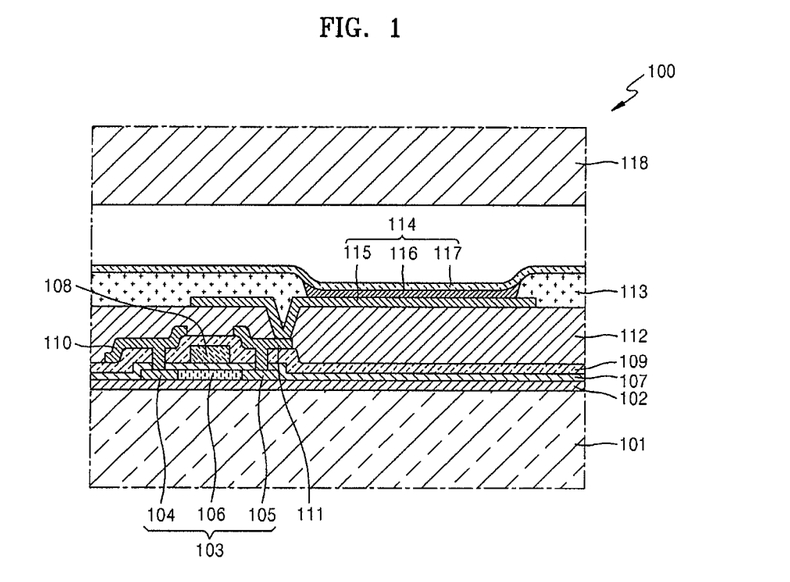
FIG. 1 is a partial cross-sectional view of a conventional organic light-emitting display device.

FIG. 1 is a cross-sectional view of a conventional organic light-emitting display device 100. Referring to FIG. 1, the organic light-emitting display device 100 includes a first substrate 101, which may be an insulating substrate formed of, for example, glass or plastic.

A buffer layer 102 is formed on the first substrate 101, and has a structure including an organic material, an inorganic material, or an organic material and inorganic material alternately stacked on each other. The buffer layer 102 blocks or reduces oxygen and moisture, and reduces or prevents moisture or impurities generated from the first substrate 101 from diffusing.

A semiconductor active layer 103 of a pattern (e.g., a predetermined pattern) is formed on the buffer layer 102. When the semiconductor active layer 103 is formed of polysilicon, the polysilicon is formed by forming and crystallizing amorphous silicon.

A variety of methods of crystallizing the amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc.

A source region 104 and a drain region 105 are formed in the semiconductor active layer 103 by doping N-type or P-type impurity ions. A channel region 106 that is not doped with impurities is formed between the source region 104 and the drain region 105.

A gate insulating layer 107 is deposited on a top portion of the semiconductor active layer 103, and may be, for example, a single layer formed of $SiO_2$ or a double layer formed of $SiO_2$ and $SiN_x$.

A gate electrode 108 is formed on a region (e.g., a predetermined region) of a top portion of the gate insulating layer 107, and is connected to a gate line (not shown) that applies a thin film transistor on/off signal. The gate electrode 108 may use a single or multi metal, and may be a single layer, such as Mo, MoW, Cr, Al, Al alloy, Mg, Ni, W, Au, etc. or a multi-layer mixture of these single layers.

An interlayer insulating layer 109 is formed on a top portion of the gate electrode 108. A source electrode 110 is electrically connected to the source region 104 via a contact hole, and a drain electrode 111 is electrically connected to the drain region 105 via a contact hole.

A protection layer 112 (e.g., a passivation layer and/or a planarization layer) is formed on top portions of the source electrode 110 and the drain electrode 111. The protection layer 112 may be formed of an organic material, such as benzocyclobutene (BCB) or acryl, or an inorganic material, such as SiNx. The protection layer 112 may be a single layer, or a double or multi layer, and may have various modifications.

A first electrode 115 of an organic light-emitting device 114 is formed on a top portion of the protection layer 112, and a pixel define layer (e.g., a pixel definition layer, a pixel defining layer, or a PDL) 113 formed of an organic material is formed to cover a part of the first electrode 115. The first electrode 115 is electrically connected to one of the source electrode 110 and the drain electrode 111.

An organic layer/organic emissive layer 116 is formed on the first electrode 115 that is exposed to the outside by etching a part of the first electrode 115. A second electrode 117 of the organic light-emitting device 114 is formed on the organic layer 116.

The first electrode 115 and the second electrode 117 are insulated from each other by the organic layer 116, and voltages having different polarities are applied across the organic light-emitting device 114 to emit light.

The first electrode 115 serves as an anode from among electrodes included in the organic light-emitting device 114, and may be formed of various conductive materials. The first electrode 115 may be a transparent electrode or a reflective electrode.

For example, when the first electrode 115 is the transparent electrode, the first electrode 115 may be formed of indium tin oxide (ITO), indium zinc oxide (IZO), zinc oxide (ZnO), or $In_2O_3$. When the first electrode 115 is the reflective electrode, the first electrode 115 may be formed by forming a reflective layer using silver (Ag), magnesium (Mg), aluminum (Al), platinum (Pt), lead (Pd), gold (Au), nickel (Ni), neodymium (Nd), iridium (Ir), chromium (Cr), or any compound thereof, and by doping the reflective layer with ITO, IZO, ZnO, or $In_2O_3$.

The second electrode 117 serves as a cathode from among the electrodes included in the organic light-emitting device 114, and may be a transparent electrode or a reflective electrode.

When the second electrode 117 is the transparent electrode, the second electrode 117 may be formed by depositing a metal having a low work function, i.e., Li, Ca, LiF/Ca, LiF/Al, Al, Ag, Mg, and compounds thereof, so as to face an orientation of the organic layer 116, and by then forming an auxiliary electrode layer or a bus electrode line formed of a transparent electrode material, such as ITO, IZO, ZnO, or $In_2O_3$, thereon.

When the second electrode 117 is the reflective electrode, the second electrode 117 may be formed by completely depositing Li, Ca, LiF/Ca, LiF/Al, Al, Ag, Mg, or compounds thereof onto the second electrode 117.

The first electrode 115 may have a shape corresponding to an opening shape of each sub-pixel when the first electrode 115 is the transparent electrode or the reflective electrode. The second electrode 117 may be formed by completely depositing the transparent electrode or the reflective electrode on a display area. The second electrode 117 might not necessarily be deposited completely (e.g., on an entirety of the display area), and may be formed into any of various patterns. In this regard, positions of the first electrode 115 and the second electrode 117 may be inversed.

The organic emissive layer 116 may be formed of a low molecular or high molecular weight organic material. If the organic emissive layer 116 is formed of the low molecular weight organic material, a hole injection layer (HIL), a hole transport layer (HTL), an emissive layer (EML), an electron transport layer (ETL), an electron injection layer (EIL), etc., may be stacked in a single or complex structure to form the organic emissive layer 116. A low molecular weight organic layer may be formed by using a vacuum evaporation method.

When the organic emissive layer 116 is the high molecular weight organic layer, the organic emissive layer 116 usually includes an HTL and an EML. A high molecular weight organic layer may be formed by a screen printing method, an inkjet printing method, or the like.

However, the present invention is not limited thereto, and the organic layer 116 may be formed in various ways.

A second substrate 118 is located on a top portion of the organic light-emitting device 114. The second substrate 118 may be a glass substrate or a flexible substrate, and may be formed by a method of coating an insulating material.

Figure 2:
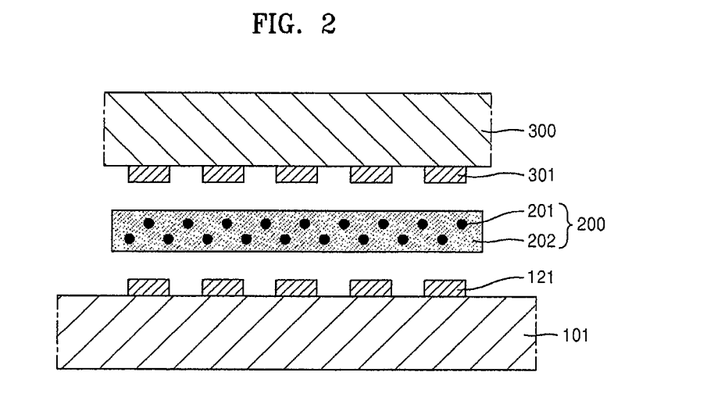
FIG. 2 is a cross-sectional view of the organic light-emitting display device of FIG. 1, a conductive film, and a circuit board that are arranged.
Figure 3:
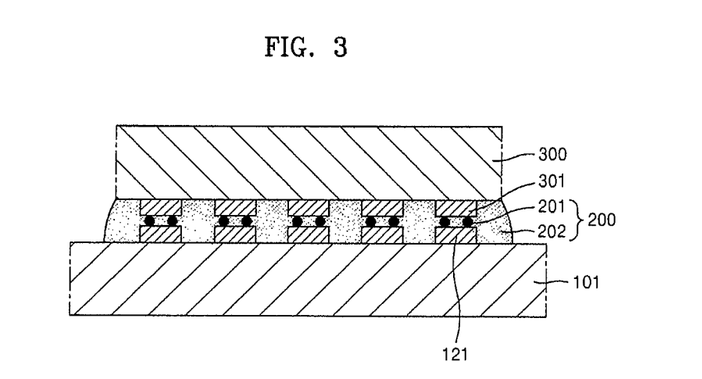
FIG. 3 is a cross-sectional view of the organic light-emitting display device, a conductive film, and a circuit board of FIG. 2, which are coupled to one another.

FIG. 2 is a cross-sectional view of the organic light-emitting display device 100 of FIG. 1, a conductive film 200, and a circuit board 300 that are arranged. FIG. 3 is a cross-sectional view of the organic light-emitting display device 100, the conductive film 200, and the circuit board 300 of FIG. 2, which are coupled to one another.

Referring to FIGS. 2 and 3, a plurality of pads 121 are arranged at one side of the first substrate 101 of the organic light-emitting display device 100. The pads 121 may be electrically connected to any one conductive layer inside the organic light-emitting display device 100, for example, the gate electrode 108 (see FIG. 1), the source electrode 110, or the drain electrode 111.

The circuit board 300 is located over the first substrate 101, and may be a flexible printed cable (FPC) that is a flexible substrate. A plurality of terminals 301 are arranged on the circuit board 300.

The conductive film 200 is interposed between the first substrate 101 and the circuit board 300. The conductive film 200 may be a film in which a current flows in a thickness direction, and may be insulated in a lengthwise or width direction, such as, for example, an anisotropic conductive film (ACF). The conductive film 200 includes a plurality of conductive particles 201, such as conductive balls, for forming an electric path, and an insulating resin 202 that improves a contact reliability by fixing the conductive particles 201 and secures electric insulation between adjacent pads 121.

In order to electrically connect the circuit board 300 to the first substrate 101, the pads 121 and the terminals 301 correspond to each other (e.g., align with each other) in a vertical direction. Accordingly, the conductive film 200 is interposed between the pads 121 and the terminals 301, and then the conductive particles 201 electrically connect the pads 121 and the terminals 301 by applying heat and pressure from above the pads 121 using a pressing apparatus such as, for example, a hot bar.

The insulating resin 202 is dispersed into a space (e.g., a region) not including portions where the pads 121 and the terminals 301 are coupled to each other, thereby preventing electrical connection between adjacent pads 121 and between adjacent terminals 301.

Here, when the organic light-emitting display device 100 is used in a large-sized electronic apparatus, such as an ultra-thin television, a large amount of current needs to be applied to the organic light-emitting display device 100, thereby increasing a resistance.

To decrease a resistance, when the number of conductive particles 201 of the conductive film 200 is increased, the adjacent pads 121 or the adjacent terminals 301 are electrically connected to one another, thereby resulting in an electrical short-circuit. As such, since an insulating characteristic of the conductive film 200 deteriorates, there is a limitation in increasing the number of conductive particles 201.

Accordingly, each of the pads 121 may be formed into a solid pattern such as, for example, a quadrilateral solid pattern. However, when fusing the conductive film 200, it is difficult to secure a space into which the insulating resin 202 may be dispersed, and thus a connection function of the conductive particles 201 is decreased, thereby decreasing adhesion of the conductive film 200 with respect to the pads 121 or the terminals 301.

As such, to enhance conductivity, a large amount of the conductive particles 201 needs to be connected, and there is a need to secure a space into which the insulating resin 202 may be dispersed when fusing the conductive film 200.

Figure 4:
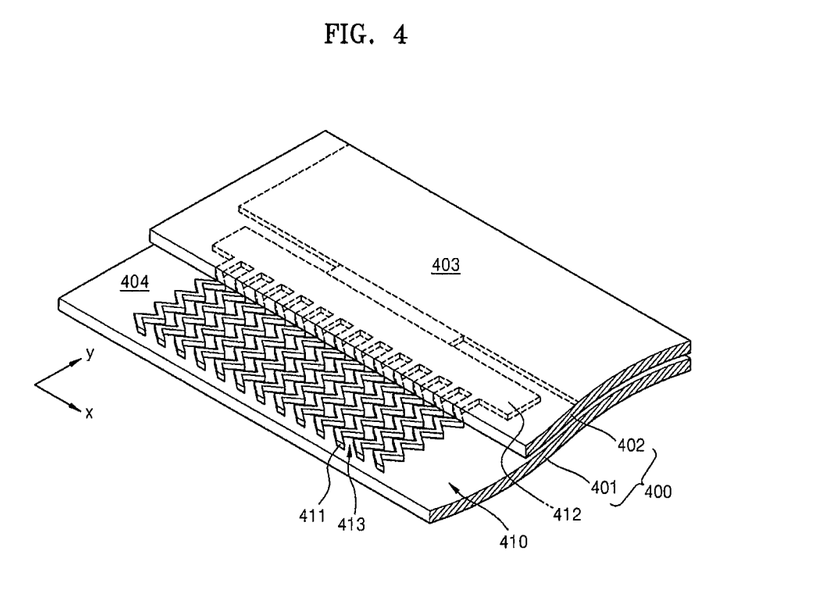
FIG. 4 is a partial perspective view of a pattern of a pad, according to an embodiment of the present invention.

FIG. 4 is a partial perspective view of a pattern of a pad, according to an embodiment of the present invention. Referring to FIG. 4, a display device 400 includes a first substrate 401 and a second substrate 402 coupled to the first substrate 401. A display unit (e.g., a display area) 403 for displaying an image during driving of the display device 400, and a non-display unit (e.g., a non-display area) 404 formed around the display unit 403, are located in the display device 400.

When the display device 400 is the organic light-emitting display device 100 (see FIG. 1), the semiconductor active layer 103, the gate insulating layer 107, the gate electrode 108, the interlayer insulating layer 109, the source electrode 110, the drain electrode 111, the protection layer 112, the first electrode 115, the organic layer 116, the second electrode 117, and the like are patterned in the display unit 403.

A plurality of first pads 410 are at one side of the first substrate 401. The first pads 410 are arranged along one side (e.g., in an x-axis direction) of the first substrate 401. The first pads 410 may be electrically connected to any one conductive layer of the display unit 403, for example, the gate electrode 108, the source electrode 110, or the drain electrode 111. Here, in the non-display unit 404 formed around the display unit 403, the first pads 410 are electrically connected to the gate electrode 108, the source electrode 110, or the drain electrode 111, but the present invention is not limited thereto.

The first pad 410 includes a plurality of fine pad lines 411. The plurality of fine pad lines 411 are arranged spaced apart from one another at intervals (e.g., predetermined intervals) in an x-axis direction of the first substrate 401. Ends of the fine pad lines 411 are electrically connected to one another via a connection line 412.

Orientation of the fine pad lines 411 (e.g., a direction of the fine pad lines 411) are changed at least once in a y-axis direction to be patterned on the first substrate 401. In other words, each fine pad line 411 is not one linear pattern in the y-axis direction of the first substrate 401, and an orientation of the fine pad line 411 is changed in a certain direction like a zigzag pattern, for example, to successively extend. When each fine pad line 411 has one linear pattern, the fine pad line 411 is vulnerable to a specific residual stress. On the other hand, as described in the embodiment of the present invention, when the fine pad line 411 is formed into a zigzag pattern, stress is properly dispersed, and thus, the fine pad line 411 is resistant to residual stress.

Here, a space 413 having a zigzag pattern is formed between the fine pad lines 411. Since the space 413 is formed between the adjacent fine pad lines 411, a space into which the insulating resin 202 may be dispersed may be secured when fusing the conductive film 200 (see FIG. 3).

The first pad 410 may be formed on the first substrate 401 through a separate process. At this time, a conductive layer, for example, the gate electrode 108, the source electrode 110, or the drain electrode 111, may be formed on the display unit 403 at the same time as when the first pad 410 is formed on the first substrate 401.

Figure 5:
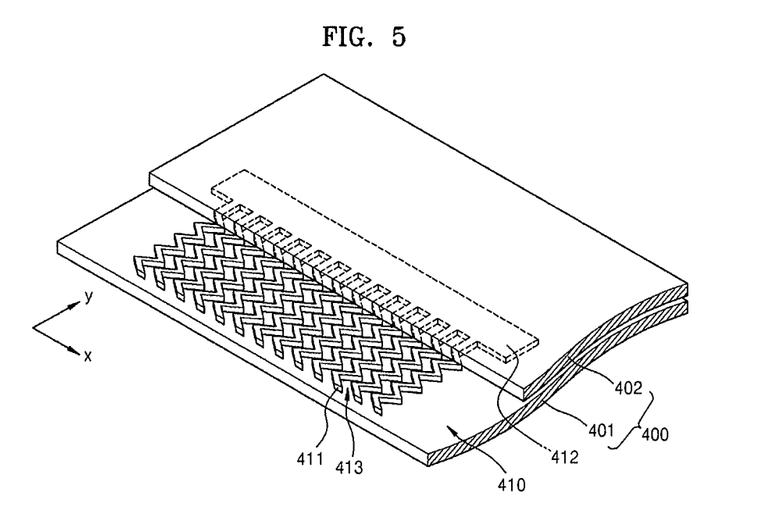
FIG. 5 is a perspective view of the patterned pad of the embodiment shown in FIG. 4.
Figure 6:
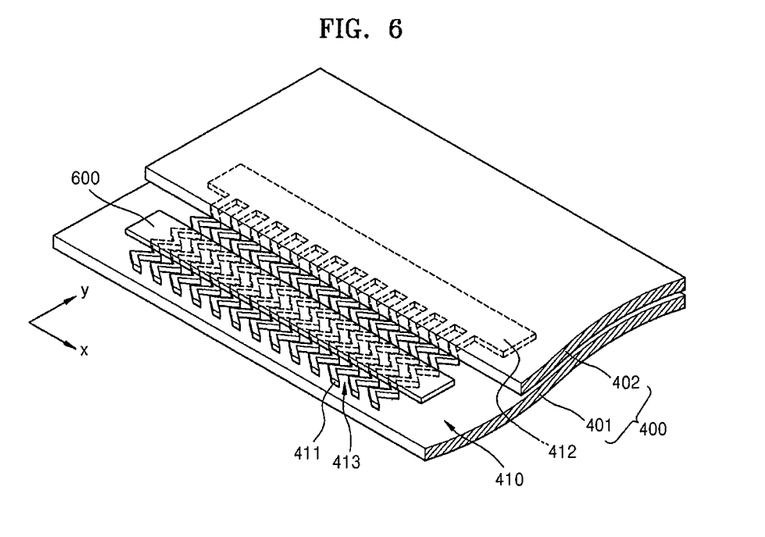
FIG. 6 is a perspective view of a conductive film connected to the pad of the embodiment shown in FIG. 5.
Figure 7:
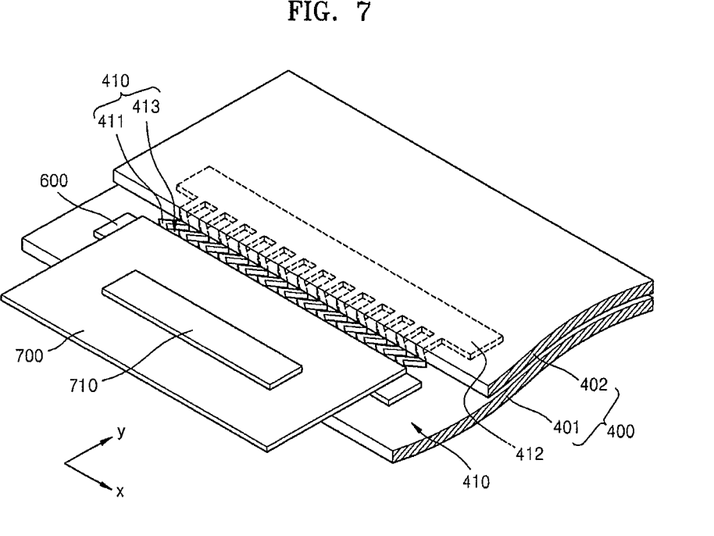
FIG. 7 is a perspective view of a circuit board connected to the pad of the embodiment shown in FIG. 6.

An electrical connection state of the first pad 410 will be described with reference to FIGS. 5 to 7. FIG. 5 is a perspective view of the first pad 410 of the embodiment shown in FIG. 4, which is patterned. FIG. 6 is a perspective view of a conductive film 600 connected to the first pad 410 of the embodiment of FIG. 5. FIG. 7 is a perspective view of a circuit board 700 connected to the conductive film 600 of the embodiment of FIG. 6.

Referring to FIG. 5, the first pad 410 is patterned at one side of the first substrate 401. The first pad 410 includes the plurality of fine pad lines 411. The fine pad lines 411 are electrically connected to one another at one end via the connection line 412. Orientation of the fine pad lines 411 is changed at least once to successively extend in a y-axis direction. In the present embodiment, each fine pad line 411 has a zigzag pattern. An open loop-type space 413 is formed between the fine pad lines 411.

Referring to FIG. 6, the conductive film 600 is on the first pad 410. The conductive film 600 may be an ACF. The conductive film 600, as described above with reference to FIG. 2, includes conductive particles, such as conductive balls, and also includes an insulating resin for fixing (e.g., suspending) the conductive particles.

Referring to FIG. 7, a circuit board 700 is on the conductive film 600. The circuit board 700 may be an FPC on which an integrated chip (IC) is mounted. Although not shown in the drawing, a terminal is patterned on one surface of the circuit board 700 facing the conductive film 600.

The first pad 410, the conductive film 600, and the circuit board 700 are arranged in a vertical direction, and then heat and pressure are applied from above the circuit board 700 by using a hot bar to electrically connect the first pad 410 and the circuit board 700.

The insulating resin included in the conductive film 600 is dispersed into the space 413 formed between the fine pad lines 411, and thus, an electrical connection between a terminal of the circuit board 700 and the fine pad lines 411 is enhanced, thereby increasing adhesion of the conductive film 600.

Figure 8:
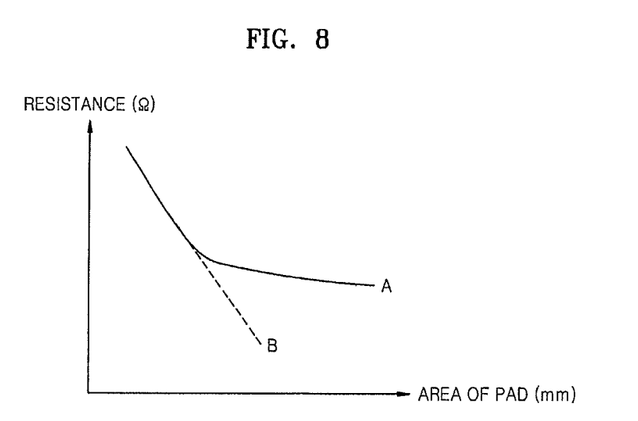
FIG. 8 is a graph showing a variation in resistance according to a variation in width of a pad.

FIG. 8 is a graph showing a variation in resistance according to a variation in width of a pad. In FIG. 8, the line A represents a conventional pad that is formed to have one solid pattern, and the line B represents the first pad 410 having the fine pad lines 411 according to the present embodiment.

Referring to FIG. 8, in the line A, a resistance is linearly decreased as a size of the pad for power supply is increased (e.g., increased to a certain size), and the resistance is no longer decreased from a certain size of the pad. This is due to the fact that a connection function of conductive particles is decreased, because it may not be possible to secure a space into which an insulating resin included in a conductive film may be dispersed due to pressure.

The line B is linearly decreased, and thus, a maximum current amount is linearly increased, and an amount of heat generation is decreased. This is due to the fact that a connection function and adhesion of the conductive particles is increased because the insulating resin included in the conductive film 600 is dispersed into the space 413 formed between the fine pad lines 411.

Figure 9:
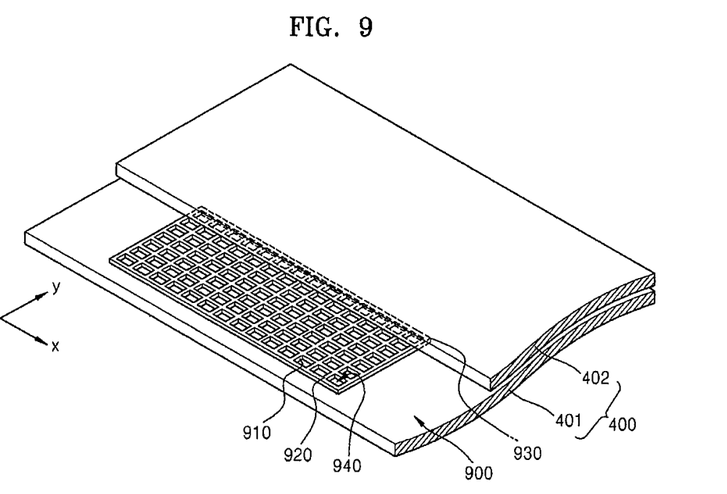
FIGS. 9 to 12 are perspective views of patterns of pads, according to other embodiments of the present invention.

FIGS. 9 to 12 are perspective view of patterns of first pads 900 to 1200, according to other embodiments of the present invention. Referring to FIG. 9, the first pad 900 is patterned at one side of the first substrate 401. The first pad 900 includes a plurality of first fine pad lines 910 electrically connected to a plurality of second fine pad lines 920.

The first fine pad lines 910 are arranged spaced apart from one another at intervals (e.g., predetermined intervals) in an x-axis direction of the first substrate 401. The second fine pad lines 920 are arranged spaced apart from one another at predetermined intervals in a y-axis direction of the first substrate 401. The first fine pad lines 910 and the second fine pad lines 920 are electrically connected to each other to form a mesh-type pattern. A connection line 930 electrically connected to the first fine pad lines 910 and the second fine pad lines 920 is patterned outside of the first fine pad lines 910 and the second fine pad lines 920.

A plurality of spaces (e.g., areas) 940 are formed between the first fine pad lines 910 and the second fine pad lines 920, respectively. Each of the spaces 940 has a quadrilateral cross-section, and is formed into a closed loop-shape (e.g., an enclosed shape). Accordingly, when fusing a conductive film, an insulating resin included in the conductive film is dispersed into the spaces 940, and a connection function of conductive particles included in the conductive film, as well as adhesion of the conductive film, are increased.

Figure 10:
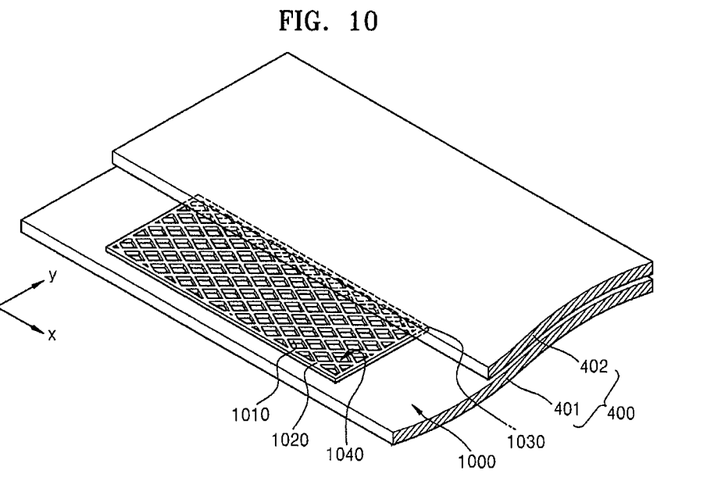

Referring to FIG. 10, the first pad 1000 is patterned at one side of the first substrate 401. The first pad 1000 includes a plurality of first fine pad lines 1010 electrically connected to a plurality of second fine pad lines 1020.

The first fine pad lines 1010 are diagonally arranged and spaced apart from one another at intervals (e.g., predetermined intervals) in one direction of the first substrate 401. The second fine pad lines 1020 are diagonally arranged spaced apart from one another at intervals (e.g., predetermined intervals) in another direction of the first substrate 401. The first fine pad lines 1010 and the second fine pad lines 1020 are electrically connected to each other to form a mesh-type pattern. A connection line 1030 electrically connected to the first fine pad lines 1010 and the second fine pad lines 1020 is patterned outside of the first fine pad lines 1010 and the second fine pad lines 1020.

Here, a plurality of spaces 1040 are formed between the first fine pad lines 1010 and the second fine pad lines 1020, respectively, thereby securing spaces into which an insulating resin included in a conductive film may be dispersed. Each of the spaces 1040 is formed into a closed loop-shape.

Figure 11:
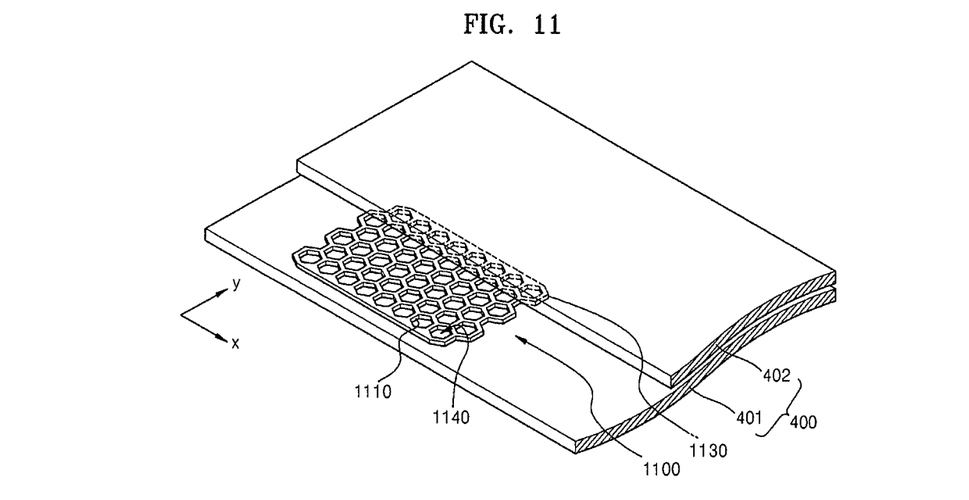

Referring to FIG. 11, the first pad 1100 is patterned at one side of the first substrate 401. The first pad 1100 includes a plurality of first fine pad lines 1110 that are electrically connected to one another to form a honeycomb pattern. A connection line 1130 is patterned at one side of the first fine pad lines 1110.

Here, each of a plurality of spaces 1140 is formed between respective ones of the first fine pad lines 1110, thereby easily securing spaces into which an insulating resin included in the conductive film may be dispersed. Each of the spaces 11040 is formed into a closed loop-shape.

Figure 12:
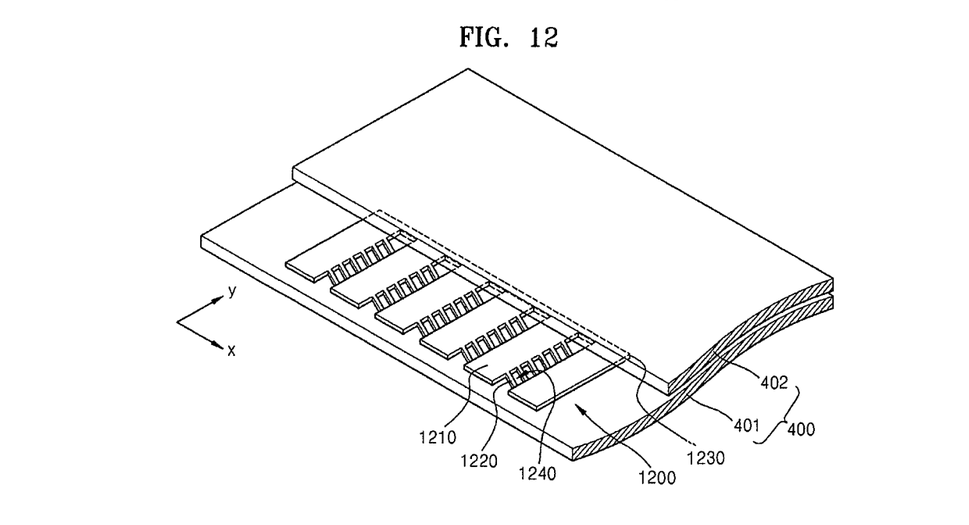

Referring to FIG. 12, the first pad 1200 is patterned at one side of the first substrate 401 and includes a plurality of first fine pad lines 1210 that are arranged spaced apart from one another at intervals (e.g., predetermined intervals) in an x-axis direction of the first substrate 401. The first fine pad line 1210 is formed into a stripe shape having a width greater than that of a bridge line 1220. The first fine pad lines 1210 are electrically connected to one another via a plurality of bridge lines 1220. A connection line 1230 is patterned at one side of the first fine pad lines 1210 to electrically connect the first fine pad lines 1210 to one another.

A plurality of spaces 1240 are formed in portions defined by the bridge lines 1220 and adjacent first fine pad lines 1210, thereby securing spaces into which an insulating resin included in a conductive film may be dispersed.

As such, unlike the conventional pad that is formed to have one solid pattern, the first pads 410, 900, 1000, 1100, and 1200, which are shown in FIGS. 4 and 9 to 12, include a plurality of conductive particles included in a conductive film, a plurality of fine pad lines, and spaces having a size of from about several μm to about several tens of mm formed between adjacent fine pad lines, instead of being formed into one solid type pad.

Figure 13:
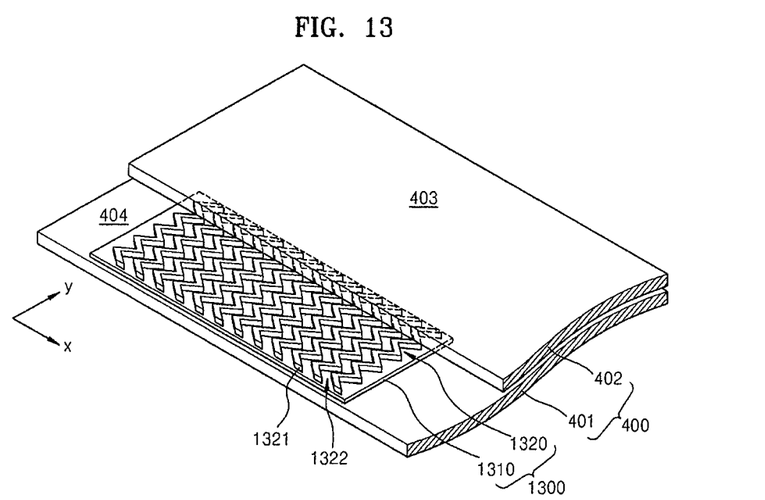
FIGS. 13 to 18 are perspective views of patterns of pads, according to other embodiments of the present invention.

FIGS. 13 to 18 are perspective view of patterns of pads 1300, 1400, 1500, 1600, 1700, and 1800, according to other embodiments of the present invention. Referring to FIG. 13, the pad 1300 includes a first pad 1310 electrically connected to a second pad 1320. The first pad 1310 and the second pad 1320 form a double-layered structure.

The first pad 1310 is directly patterned on a top surface of the first substrate 401, and is formed to have a solid type pattern and a quadrilateral cross-section.

The second pad 1320 is patterned on a top surface of the first pad 1310, and includes a plurality of fine pad lines 1321. The fine pad lines 1321 are arranged spaced apart from one another at intervals (e.g., predetermined intervals) in an x-axis direction on a top surface of the first pad 1310, and thus, a connection line for connecting the fine pad lines 1321 to one another might not be necessarily formed.

Orientation of the fine pad lines 1321 is changed at least once to be patterned on the top surface of the first pad 1310. In the present embodiment, each fine pad line 1321 is formed to have a zigzag pattern.

Here, a plurality of spaces 1322 are formed between the adjacent fine pad lines 1321, thereby securing spaces into which an insulating resin included in a conductive film may be dispersed when fusing the conductive film.

Meanwhile, the first pad 1310 and the second pad 1320 may be individually formed through separate processes. However, when the display device 400 is the organic light-emitting display device 100 (see FIG. 1), the first pad 1310 may be formed at the same time as the gate electrode 107, and the second pad 1320 may be formed at the same time as the drain electrode 111.

In the non-display unit 404 formed around the display unit 403, the first pad 1310 is electrically connected to the gate electrode 108, and the second pad 1320 is electrically connected to the source electrode 110 or the drain electrode 111, although the present invention is not limited thereto.

Figure 14:
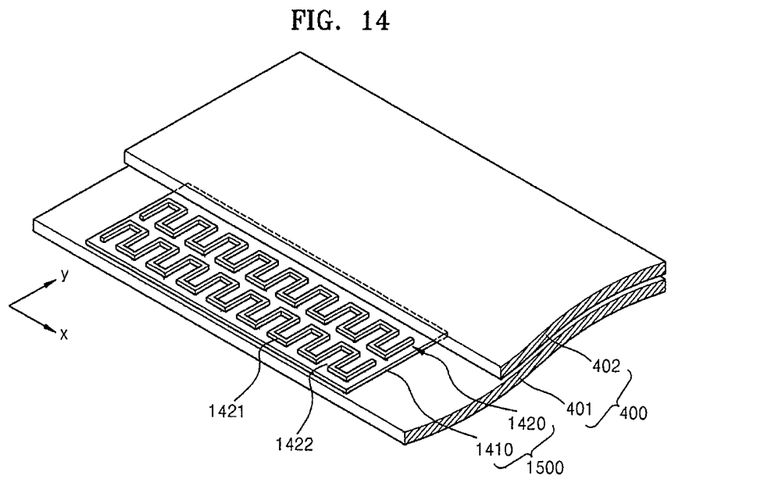

Referring to FIG. 14, the pad 1400 includes a first pad 1410 electrically connected to a second pad 1420. The first pad 1410 and the second pad 1420 form a double-layered structure.

The first pad 1410 has a solid type pattern in which the first pad 1410 is directly patterned on a top surface of the first substrate 401, and has a quadrilateral cross-section.

The second pad 1420 is patterned on a top surface of the first pad 1410, and includes a plurality of fine pad lines 1421, which extend in an x-axis direction of the first substrate 401 and are arranged spaced apart from one another at intervals (e.g., predetermined intervals) in a y-axis direction. The fine pad lines 1421 are arranged on a top surface of the first pad 1410, and thus a connection line for connecting the fine pad lines 1421 to one another might not be necessarily formed.

Here, a plurality of spaces 1422 are formed in portions where the fine pad lines 1421 are not formed, thereby securing spaces into which an insulating resin included in a conductive film may be dispersed when fusing the conductive film.

Figure 15:
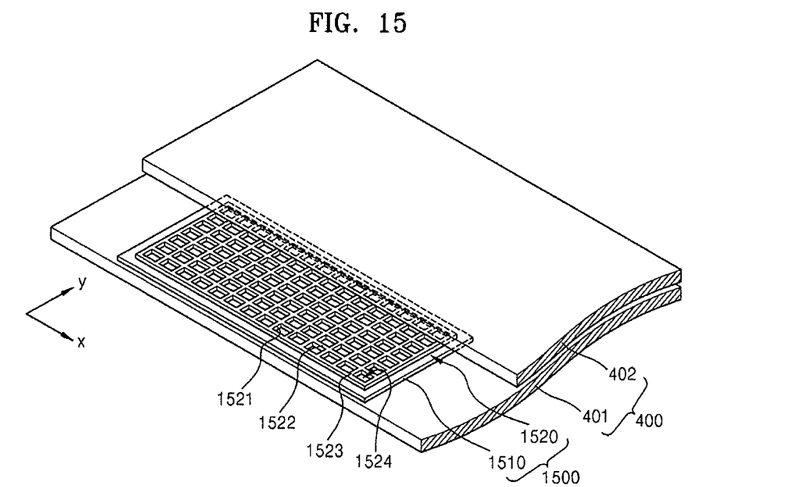

Referring to FIG. 15, the pad 1500 includes a first pad 1510 electrically connected to a second pad 1520. The first pad 1510 and the second pad 1520 form a double-layered structure.

The first pad 1510 has a solid type pattern, in which the first pad 1510 is directly patterned on a top surface of the first substrate 401, and has a quadrilateral cross-section.

The second pad 1520 is patterned on a top surface of the first pad 1510, and includes a plurality of first fine pad lines 1521 electrically connected to a plurality of second fine pad lines 1522.

The first fine pad lines 1521 are arranged spaced apart from one another at intervals (e.g., predetermined intervals) in an x-axis direction of the first substrate 401. The second fine pad lines 1522 are arranged spaced apart from one another at intervals (e.g., predetermined intervals) in a y-axis direction of the first substrate 401. The first fine pad lines 1521 and the second fine pad lines 1522 are electrically connected to each other to form a mesh-type pattern. A connection line 1523 electrically connected to the first fine pad lines 1521 and the second fine pad lines 1522 is patterned outside of the first fine pad lines 1521 and the second fine pad lines 1522.

A plurality of spaces 1524 are formed between the first fine pad lines 1521 and the second fine pad lines 1522, respectively. Each of the spaces 1524 has a quadrilateral cross-section and is formed into a closed loop-shape. Accordingly, when fusing a conductive film, an insulating resin included in the conductive film is dispersed into the spaces 1524, and a connection function of conductive particles included in the conductive film, as well as adhesion of the conductive film, are increased.

Figure 16:
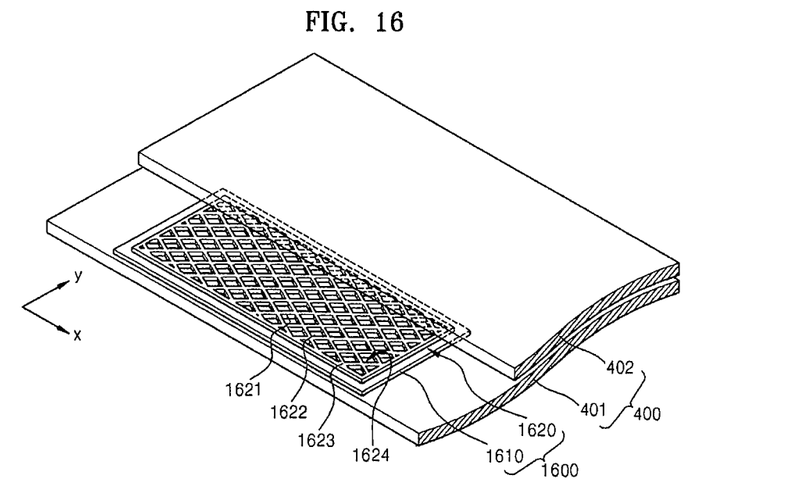

Referring to FIG. 16, the pad 1600 includes a first pad 1610 electrically connected to a second pad 1620. The first pad 1610 and the second pad 1620 form a double-layered structure.

The first pad 1610 has a solid type pattern, in which the first pad 1610 is directly patterned on a top surface of the first substrate 401, and has a quadrilateral cross-section.

The second pad 1620 is patterned on a top surface of the first pad 1610. The second pad 1620 includes a plurality of first fine pad lines 1621 electrically connected to a plurality of second fine pad lines 1622.

The first fine pad lines 1621 are diagonally arranged spaced apart from one another at intervals (e.g., predetermined intervals) in one direction of the first substrate 401. The second fine pad lines 1622 are diagonally arranged spaced apart from one another at intervals (e.g., predetermined intervals) in another direction of the first substrate 401. A connection line 1623 electrically connected to the first fine pad lines 1621 and the second fine pad lines 1622 is patterned outside of the first fine pad lines 1621 and the second fine pad lines 1622.

Here, a plurality of spaces 1624 are formed between the first fine pad lines 1621 and the second fine pad lines 1622, respectively, thereby securing spaces into which an insulating resin included in a conductive film may be dispersed.

Figure 17:
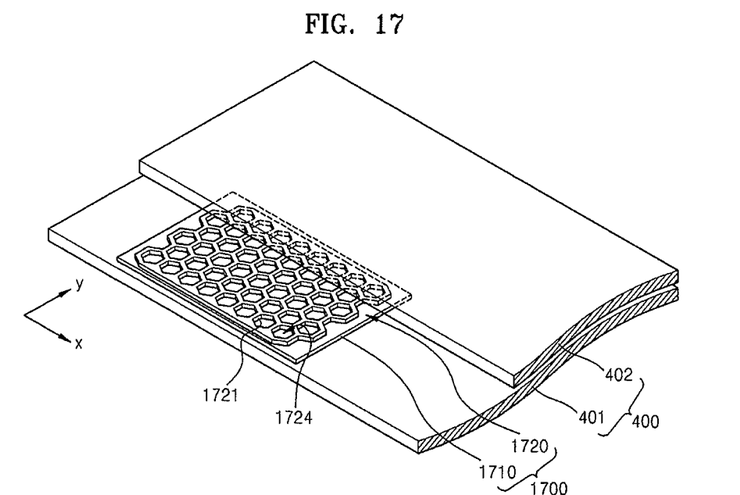

Referring to FIG. 17, the pad 1700 includes a first pad 1710 electrically connected to a second pad 1720. The first pad 1710 and the second pad 1720 form a double-layered structure.

The first pad 1710 has a solid type pattern, in which the first pad 1710 is directly patterned on a top surface of the first substrate 401, and has a quadrilateral cross-section.

The second pad 1720 is patterned on a top surface of the first pad 1710. The second pad 1720 includes a plurality of first fine pad lines 1721. Each first fine pad line 1721 has a hexagonal cross-section. The first fine pad lines 1721 are connected to one another to form a honeycomb pattern.

A plurality of spaces 1724 are formed between respective ones of the first fine pad lines 1721, thereby securing spaces into which an insulating resin included in a conductive film may be dispersed when fusing the conductive film.

Figure 18:
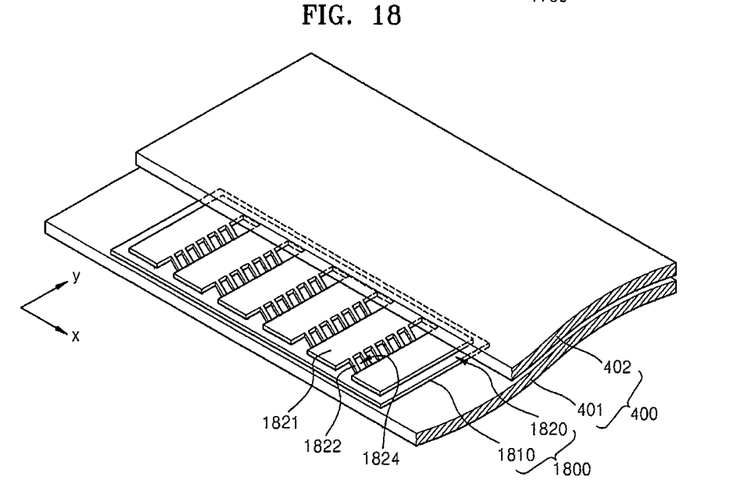

Referring to FIG. 18, the pad 1800 includes a first pad 1810 electrically connected to a second pad 1820. The first pad 1810 and the second pad 1820 form a double-layered structure.

The first pad 1810 has a solid type pattern in which the first pad 1810 is directly patterned on a top surface of the first substrate 401.

The second pad 1820 is patterned on a top surface of the first pad 1810. The second pad 1820 includes a plurality of first fine pad lines 1821. The first fine pad lines 1821 are arranged spaced apart from one another at intervals (e.g., predetermined intervals) in an x-axis direction of the first substrate 401. The adjacent first fine pad lines 1821 are electrically connected to one another via a plurality of bridge lines 1822.

A plurality of spaces 1824 are formed in portions where the bridge lines 1822 are not formed between the adjacent first fine pad lines 1821, thereby securing spaces into which an insulating resin included in a conductive film may be dispersed.

As such, unlike a conventional pad that is formed to have one solid pattern, the pads 1300 to 1800 shown in FIGS. 13 to 18 have a double-layered structure including a first pad, which has a solid-type pattern, and a second pad, which includes a plurality of fine pad lines formed thereon and a plurality of spaces formed between adjacent ones of the fine pad lines, thereby decreasing resistance, increasing adhesion, and increasing reliability.

As such, in the display device of embodiments of the present invention, a pad, a circuit board, and a conductive film are electrically connected to one another by patterning the pad into a specific pattern, and thus, increasing adhesion between the pad, the circuit board, and the conductive film, thereby decreasing a contact resistance.

Also, a space, or region, where an insulating resin included in a conductive film is formed between adjacent fine pad lines, thereby securing the most of an electrical contact area between conductive balls in the conductive film and a pad and a circuit board.

In addition, since the conductive film is used, the circuit board formed of a relatively inexpensive FPC can be used.

Furthermore, a pattern of the pad may be formed at the same time as when a conductive layer, such as a gate electrode patterned in a display unit on a substrate, is formed, thereby reducing manufacturing costs of the display device.

Also, since adhesion between the pad, the circuit board, and the conductive film is increased, even though a large amount of current flows, reliability can be secured.

While the present invention has been particularly shown and described with reference to exemplary embodiments thereof, it will be understood by those of ordinary skill in the art that various changes in form and details may be made therein without departing from the spirit and scope of the present invention as defined by the following claims, and their equivalents.

What is claimed is:

1. A display device comprising:
   a substrate comprising a display unit for displaying an image, a non-display unit around the display unit, and at least one first pad for sending an electrical signal to the display unit;
   a circuit board on the substrate and comprising at least one circuit terminal; and
   a conductive film between the substrate and the circuit board and comprising:
      a plurality of conductive particles for electrically connecting the first pad and the circuit terminal; and
      an insulating resin surrounding the conductive particles,
   wherein the first pad comprises:
      a plurality of fine pad lines that are electrically connected to one another via a connection line; and
      a region into which the insulating resin is dispersed during a thermal compressing operation located between adjacent ones of the fine pad lines.

2. The display device of claim 1, wherein orientations of the fine pad lines patterned on the substrate are changed at least once in one direction of the substrate.

3. The display device of claim 2, wherein the fine pad lines are arranged in a zigzag pattern.

4. The display device of claim 1, wherein the fine pad lines comprise:
   a plurality of first fine pad lines arranged apart from one another in one direction of the substrate; and
   a plurality of second fine pad lines arranged apart from one another in another direction of the substrate,
   wherein the first fine pad lines and the second fine pad lines are electrically connected to each other to form a mesh-type pattern.

5. The display device of claim 1, wherein the fine pad lines comprise:
   a plurality of first fine pad lines diagonally arranged apart from one another in one direction of the substrate; and
   a plurality of second fine pad lines diagonally arranged apart from one another in another direction of the substrate,
   wherein the first fine pad lines and the second fine pad lines are electrically connected to each other to form a mesh-type pattern.

6. The display device of claim 1, wherein the plurality of fine pad lines are electrically connected to one another to form a honeycomb pattern.

7. The display device of claim 1, further comprising a bridge line between the adjacent ones of the fine pad lines for electrically connecting the adjacent ones of the fine pad lines,
   wherein the fine pad lines are arranged apart from one another in one direction of the substrate.

8. The display device of claim 1, wherein the conductive film comprises an anisotropic conductive film (ACF).

9. The display device of claim 1, wherein the substrate is for an organic display device,
   wherein a semiconductor active layer having source and drain regions and a channel region, a gate insulating layer on the semiconductor active layer, a gate electrode on the gate insulating layer, an interlayer insulating layer on the gate electrode and having a contact hole, source and drain electrodes electrically connected to the source and drain regions, respectively, and a protection layer on the interlayer insulating layer, are located in the display unit on the substrate, and
   wherein the first pad is electrically connected to the gate electrode or the source and drain electrodes in the non-display unit around the display unit.

10. The display device of claim 1, wherein an integrated chip (IC) is mounted on the circuit board that is flexible.

11. A display device comprising:
    a substrate comprising a display unit for displaying an image, a non-display unit around the display unit, at least one first pad for sending an electrical signal to the display unit, and a second pad electrically connected to the first pad at a layer other than a layer at which the first pad is located;
    a circuit board on the substrate and comprising at least one circuit terminal; and
    a conductive film between the substrate and the circuit board and comprising:
       a plurality of conductive particles for electrically connecting the first pad and the circuit terminal; and
       an insulating resin surrounding the conductive particles,
    wherein the first pad comprises:
       a plurality of fine pad lines; and
       a region into which the insulating resin is dispersed during a thermal compressing operation located between adjacent ones of the fine pad lines.

12. The display device of claim 11, wherein the second pad is between the first pad and the substrate.

13. The display device of claim 11, wherein orientations of the fine pad lines patterned on the substrate are changed at least once in one direction of the substrate, and
    wherein the second pad has a solid type pattern in which the fine pad lines are arranged on one surface thereof.

14. The display device of claim 11, wherein the fine pad lines comprise:
    a plurality of first fine pad lines arranged apart from one another in one direction of the substrate; and
    a plurality of second fine pad lines arranged apart from one another in another direction of the substrate,
    wherein the first fine pad lines and the second fine pad lines are electrically connected to each other to form a mesh-type pattern, and
    wherein the second pad has a solid type pattern in which the fine pad lines are arranged on one surface thereof.

15. The display device of claim 11, wherein the fine pad lines comprise:
    a plurality of first fine pad lines diagonally arranged apart from one another in one direction of the substrate; and
    a plurality of second fine pad lines diagonally arranged apart from one another in another direction of the substrate,
    wherein the first fine pad lines and the second fine pad lines are electrically connected to each other to form a mesh-type pattern, and
    wherein the second pad has a solid type pattern in which the fine pad lines are arranged on one surface thereof.

16. The display device of claim 11, wherein the plurality of fine pad lines are electrically connected to one another to form a honeycomb pattern, and
    wherein the second pad has a solid type pattern in which the fine pad lines are arranged on one surface thereof.

17. The display device of claim 11, further comprising a bridge line between the adjacent ones of the fine pad lines for electrically connecting the adjacent ones of the fine pad lines,
    wherein the fine pad lines are arranged apart from one another in one direction of the substrate, and
    wherein the second pad has a solid type pattern in which the fine pad lines are arranged on one surface thereof.

18. The display device of claim 11, wherein the substrate is for an organic display device,
    wherein a semiconductor active layer having source drain regions and a channel region, a gate insulating layer on the semiconductor active layer, a gate electrode on the gate insulating layer, an interlayer insulating layer that is on the gate electrode and in which a contact hole is located, source and drain electrodes that are electrically connected to the source drain regions, respectively, and a protection layer on the interlayer insulating layer, are located in the display unit on the substrate, wherein, the first pad is electrically connected to the gate electrode in the non-display unit, and the second pad is electrically connected to the source and drain electrodes in the non-display unit.

\* \* \* \* \*